(12) United States Patent
Phan Le

(10) Patent No.: US 7,468,905 B2
(45) Date of Patent: Dec. 23, 2008

(54) MAGNETIC FIELD SHAPING CONDUCTOR

(75) Inventor: Kim Phan Le, Eindhoven (NL)

(73) Assignee: NXP B.V., Eindhoven (NL)

( * ) Notice: Subject to any disclaimer, the term of this patent is extended or adjusted under 35 U.S.C. 154(b) by 175 days.

(21) Appl. No.: 10/574,365

(22) PCT Filed: Oct. 1, 2004

(86) PCT No.: PCT/IB2004/051941

§ 371 (c)(1),
(2), (4) Date: Mar. 30, 2006

(87) PCT Pub. No.: WO2005/034132

PCT Pub. Date: Apr. 14, 2005

(65) Prior Publication Data

US 2007/0120209 A1    May 31, 2007

(30) Foreign Application Priority Data

Oct. 6, 2003    (EP) .................................. 03103682

(51) Int. Cl.
*G11C 11/00*    (2006.01)
(52) U.S. Cl. .................. 365/158; 365/171; 365/173; 438/3

(58) Field of Classification Search .............. 257/421, 257/427; 365/158, 171, 173; 438/3
See application file for complete search history.

(56) References Cited

U.S. PATENT DOCUMENTS 6,873,055 B2 *    3/2005    Bangert .................. 257/775
6,914,805 B2 *    7/2005    Witcraft et al. ............ 365/158

OTHER PUBLICATIONS

WO 02/41367 Jones et al. "Self-Aligned Magnetic Clad Write Line and Method Thereof." published May 22, 2002.*

* cited by examiner

*Primary Examiner*—Van Thu Nguyen
*Assistant Examiner*—Alexander Sofocleous
(74) *Attorney, Agent, or Firm*—Peter Zawilski

(57) ABSTRACT

An integrated circuit arrangement having at least one electrical conductor which, when a current flows through it, produces a magnetic field which acts on at least a further part of the circuit arrangement. The electrical conductor has a first side oriented towards the at least further part of the circuit arrangement and comprises a main line of conductive material, and, connected to its first side, at least one field shaping strip made of magnetic material. Due to the field shaping strip, the inhomogeneity of the magnetic field profile above the electrical conductor is reduced.

15 Claims, 7 Drawing Sheets

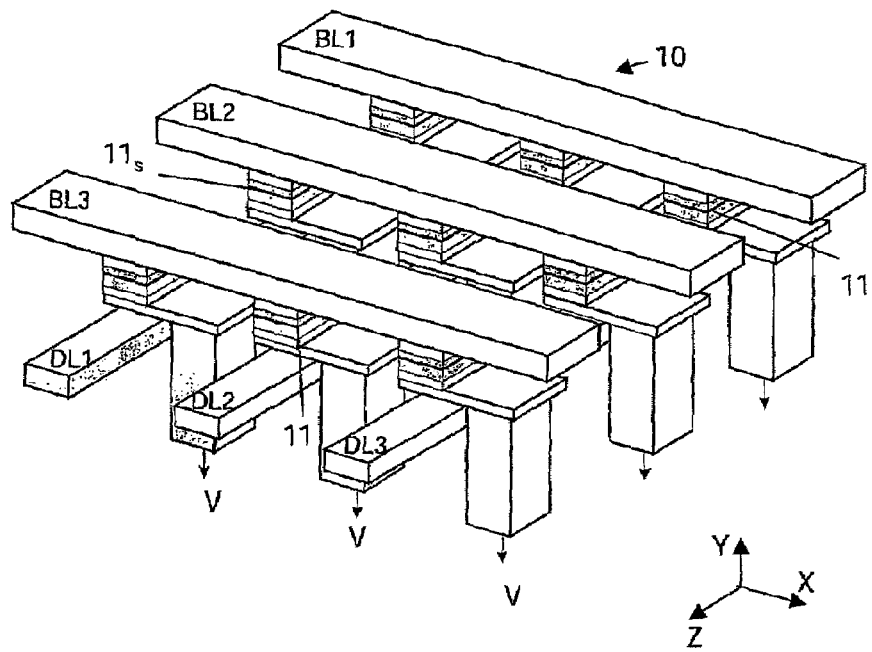
FIG.1
(Prior Art)
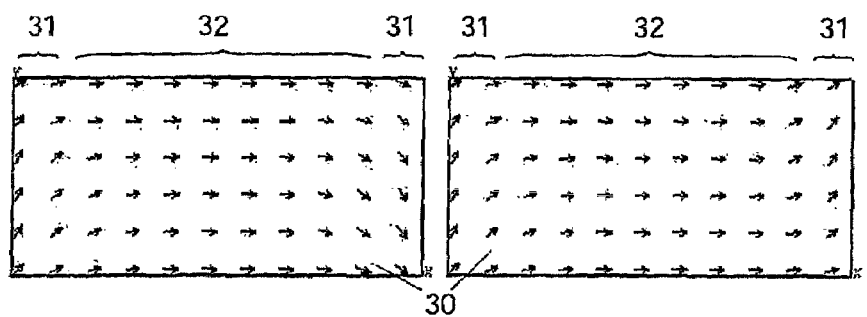
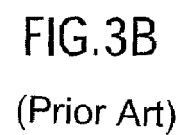
FIG.3A          FIG.3B
(Prior Art)          (Prior Art)

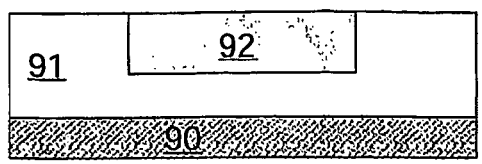
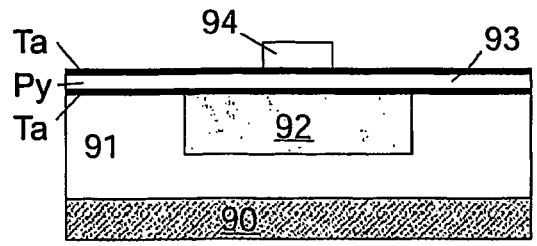
FIG.9A  FIG.9B
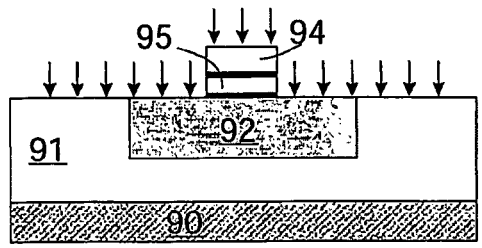
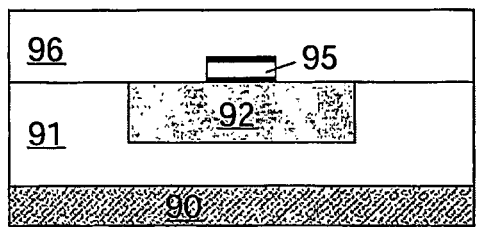
FIG.9C  FIG.9D
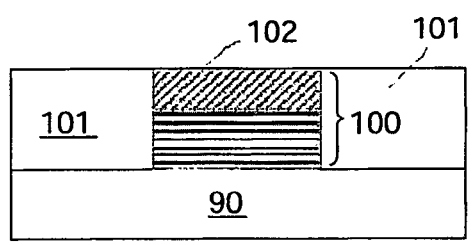
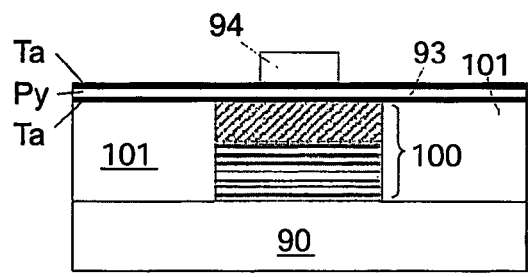
FIG.10A  FIG.10B
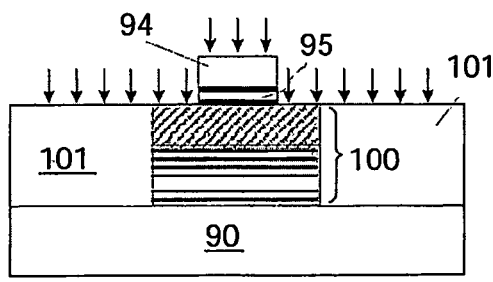
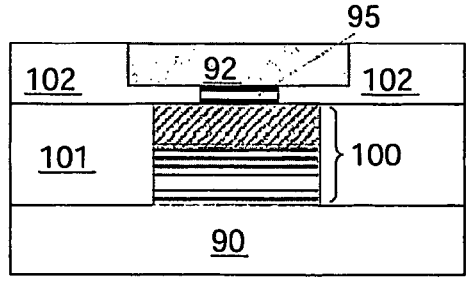
FIG.10C  FIG.10D

MAGNETIC FIELD SHAPING CONDUCTOR

The present invention relates to an integrated circuit arrangement having at least one electrical conductor, which, when current flows through it, produces a magnetic field which acts on at least one further part of the circuit arrangement as well as a method of manufacturing the same.

Integrated circuit arrangements having at least one electrical conductor which, when current flows through it, produces a magnetic field which acts on at least one further part of the circuit arrangement, are known, for example in the form of magnetocouplers or current sensors. In such an arrangement, a conductor through which a current flows, generates a magnetic field which is picked up in the circuit arrangement by means of the further part formed e.g. as a measurement element for measuring the magnetic field generated.

One integrated circuit arrangement that has been developed relatively recently is a magnetic or magnetoresistive random access memory (MRAM) cell. MRAM is currently being considered by many companies as a successor to flash memory. It has the potential to replace all but the fastest static RAM (SRAM) memories. This makes MRAM very suitable as embedded memory for System on Chip (SoC). It is a non-volatile memory (NVM) device, which means that no power is required to sustain the stored information. This is seen as an advantage over most other types of memory.

The MRAM concept was originally developed at Honeywell Corp. USA, and uses magnetisation direction in a magnetic multi-layer device as information storage and the resultant resistance difference for information readout. As with all memory devices, each cell in an MRAM array must be able to store at least two binary states which represent either a "1" or a "0".

Different kinds of magnetoresistive (MR) effects exist, of which the Giant Magneto-Resistance (GMR) and Tunnel Magneto-Resistance (TMR) are currently the most important ones. The GMR effect and the TMR or Magnetic Tunnel Junction (MTJ) or Spin Dependent Tunneling (SDT) effect provide possibilities to realise a.o. non-volatile magnetic memories. These devices comprise a stack of thin films of which at least two are ferromagnetic or ferrimagnetic, and which are separated by a non-magnetic interlayer. GMR is the magneto-resistance for structures with conductor inter-layers and TMR is the magneto-resistance for structures with dielectric inter-layers. If a very thin conductor is placed between two ferromagnetic or ferrimagnetic films (GMR), then the effective in-plane resistance of the composite multi-layer structure is smallest when the magnetisation directions of the films are parallel and largest when the magnetisation directions of the films are anti-parallel. If a thin dielectric interlayer is placed between two ferromagnetic or ferrimagnetic films (TMR), tunneling current between the films is observed to be the largest (or thus resistance to be the smallest) when the magnetisation directions of the films are parallel and tunneling current between the films is the smallest (or thus resistance the largest) when the magnetisation directions of the films are anti-parallel.

Magneto-resistance is usually measured as the percentage increase in resistance of the above structures going from parallel to anti-parallel magnetisation states. TMR devices provide higher percentage magneto-resistance than GMR structures, can be patterned to very small dimensions and need very small sense current compared to GMR devices, thus having the potential for measuring small signals with higher partial resolution and low power consumption. Recent results indicate TMR giving over 40% magneto-resistance, compared to 10-14% magneto-resistance in good GMR cells.

A typical MRAM device comprises a plurality of magnetoresistive memory elements, e.g. magnetic tunneling junction (MTJ) elements, arranged in an array. MTJ memory elements generally include a layered structure comprising a fixed (or pinned) layer, a free layer and a dielectric barrier in between. The pinned layer of magnetic material has a magnetisation vector that always points in the same direction. The magnetisation vector of the free layer is relatively free, but at zero external magnetic field, it is constrained within the easy axis of the layer, which is determined chiefly by the physical dimensions of the element. In the absence of an external field, the magnetisation vector of the free layer points in either of two directions: parallel or anti-parallel with the magnetisation direction of the pinned layer, which coincides with the said easy axis. The fundamental principle of MRAM is the storage of information as binary data, e.g. as "0" and "1", based on directions of remanence magnetisation. This is why the magnetic data is non-volatile and will not change until it is affected by an external magnetic field.

The storage principle of MRAM is based on remanence magnetisation direction of a free magnetic layer in e.g. magnetic tunnel junction (MTJ) cells, i.e. the magnetisation remaining in a material when the magnetising force (external field) has been reduced to zero.

Storing data is accomplished by applying magnetic fields and thereby causing magnetic material in the free layer to be magnetised into either of two possible memory states. When the free layer of the layered structure of an MRAM-cell is magnetised in the same direction with that of the pinned layer (magnetisation directions are parallel), the data is either of two binary values, e.g. "0", otherwise, if both magnetisation directions of the two ferromagnetic layers are anti-parallel, the data is the other binary value, e.g. "1". The magnetic fields are created by passing currents through strip lines (word lines and bit lines) external to the magnetic structures. In an MRAM array, comprising a plurality of MRAM cells, substantially orthogonal lines pass under and over each memory bit, carrying current that produces the switching field. Writing of information is thus done by sending simultaneous current pulses through a digit line and a bit line which cross in the region of the selected cell. The digit line and bit line are also called word line and bit line. The current pulses will create a resultant magnetic field at the crossing point in such a way that only the addressed cell is exposed to a sufficient field that is able to switch the magnetisation of the free layer, while other cells are not affected. Each cell is designed so that it will not switch when current is applied to just one line, but will switch, depending on the direction of the current in the current lines and on the state of the memory cell, when current is flowing through both lines that cross at the selected cell.

Reading of information stored in an MRAM memory cell is based on tunneling magneto-resistance (TMR) effect. Reading data is accomplished by sensing resistance changes in a cell when no magnetic fields are applied. Making use of the fact that the resistance of the layered structure varies depending on whether or not the orientations are parallel, the system can discriminate both binary values of the data, e.g. "0" or "1". The most common MRAM design is the type 1T1MTJ (1 transistor per 1 MTJ cell), as illustrated in FIG. 1. The memory array 10 comprises orthogonal bit lines BL1, BL2, BL3 and digit lines DL1, DL2, DL3 patterned separately into two metal layers respectively under and above the magnetic tunnel junction (MTJ) stacks 11. The bit lines BL1, BL2, BL3 are parallel with the hard axis of the cells, which creates a field in the easy axis, while the digit lines DL1, DL2, DL3 otherwise create a field in the hard axis. In some designs the relations can be reversed, i.e. the bit lines may create a hard axis field and the digit lines may create an easy axis field. Writing on a selected cell $11_s$ is done by simultaneously applying current pulses through the respective bit lines BL2 and the digit lines DL1 that intersect at the cell $11_s$. The direction of the resultant field makes an angle of 45° with respect to the easy axis of the free layer of the cell $11_s$. At this angle, the switching field of the free layer is the smallest, thus writing can be done with the least current.

One of the issues of MRAM is the field created by the straight conductor lines 20 (i.e. digit lines DL1, DL2, DL3 or bit lines BL1, BL2, BL3) during write operations is rather inhomogeneous. FIG. 2A gives an impression of the field profile 21 measured along a line that crosses the MTJ in the transversal direction with respect to a conductor line 20, such as e.g. digit line DL1. When the conductor line 20 carries a current in its longitudinal direction, i.e. in the Z-direction according to the axis shown in FIG. 1, the magnetic field component in the transversal direction of the conductor line, which transversal direction is parallel to the plane of the free layer, i.e. the Hx-field in the X-direction, has a bell-shaped profile. The field is strongest at the middle of the conductor 20 and decreases drastically toward the edges. The amount of decrease depends on the distance between the conductor and the measurement plane, and can be about 30%, as shown in the example in FIG. 2A. In the example illustrated in FIG. 2A, the conductor 20 for example has a width in the X-direction of 1000 nm and a height in the Y-direction of 300 nm. The distance from the top face of the conductor 20 to the plane where the magnetic field is calculated is in the example given 170 nm, which corresponds to a typical distance between the top face of a digit line and an MTJ element in an MRAM array. A current of 10 mA is assumed to flow in the conductor 20.

Obviously the inhomogeneity of the write field does not favour the coherent rotation of magnetisation of the free layer of an MRAM element during writing because different parts of the layer would see different field strengths. This results in difficulty in magnetic switching. Consequently more current is needed in order to nicely switch the magnetisation direction of the free layer of the MRAM element, as more current through the conductor 20 results in a higher magnetic field. Another disadvantage of the bell-shaped profile is that it does not favour the switching sequence of the elements. This will be explained more detailed hereinafter.

It is known from micro-magnetic simulations and micro-magnetic observations such as Magnetic Force Microscopy (MFM) that in small ferromagnetic elements 30 like the free layer in a MRAM cell, at the remanence state, there is still some deviation of magnetisation directions at the ends of the element 30 due to the demagnetising field of the element 30 itself. There are two common magnetisation patterns in rectangular elements 30, which are C-type as illustrated in FIG. 3A and S-type as illustrated in FIG. 3B. The size of the elements 30 represented in FIG. 3A and FIG. 3B is 320×160 mm², and the patterns illustrated are calculated using the Landau-Lifshitz-Gibert micro-magnetic simulator. When a homogeneous field is applied to such an element 30 in a direction opposite to the current direction of the magnetisation indicated by the arrows in FIG. 3A and FIG. 3B, first of all the magnetic moments near the ends 31 of the element 30 will rotate, and the end parts extend towards the central part 32, followed by the complete switching of the magnetic moments of the central part 32. Apparently the bell-shaped field profile does not favour this sequence because the end parts 31 which must rotate first, are exposed to a significantly lower field than the central part 32 which can only switch after the end parts 31 have substantially rotated. The consequence is that the element 30 will only switch at higher average field than it would do when the field is more homogeneous.

A simple way to reduce the inhomogeneity of the magnetic field is to enlarge the width of the conductor line 20 while placing the element 30 at the centre region of the line 20, because of two reasons: (1) the field inhomogeneity is smaller when only the central part of the bell-shaped profile is actually used, and (2) with a fixed distance from the element 30 to the conductor 20, the wider the conductor 20, the flatter the field profile becomes. When the conductor 20 width is much (or significantly) larger than the distance to the element 30, e.g. when the conductor width is 10 times or more larger than the distance, the profile is not bell-shaped anymore but it has a rather flat plateau at the central region. This is illustrated in FIG. 2B, showing two graphs 22, 23. Graph 22 corresponds to graph 21 of FIG. 2A, i.e. the dimensions of the conductor 20 and the distance between the conductor 20 and the measuring plane are the same as in FIG. 2A. Graph 23 illustrates a case where the distance between the conductor 20 and the measuring plane is kept the same, but the width of the conductor 20 is now 6 times as large as the width of the conductor 20 of graph 22. The height of the conductor 20 is the same for both cases of graph 22 and 23. In case of graph 22, a current of 10 mA is sent through the conductor 20. In order to generate enough magnetic field comparable to the first case, a current of 41 mA is sent through the conductor 20. It can be seen that in the second case a substantially flat portion is obtained in graph 23. However, enlarging the conductor 20 width is not desired because besides losing the scalability of e.g. the MRAM array 10, with the same current flowing through the conductor 20, the field strength drops hyperbolically with increasing the conductor 20 width. In practice, the element 30 width is normally some 50-80% of the conductor 20 width. With such geometry, a variation in field strength of about 15-20% between a location at a first distance above the central part of the conductor 20 and a location at the first distance above the edges of the MTJ element still exists.

Another possibility for reducing the inhomogeneity of the magnetic field generated by current flowing through a conductor is described in EP-1195820. According to this document, the conductor has a recess or depression, or a region of reduced conductivity on that side which faces the part of the circuit to be influenced by the magnetic field generated. The document provides for the variation of the effective conductor geometry in a specific region, and hence for the region within which the current is transported, to be varied. This is achieved by the thickness or diameter of a section or central region of the conductor being reduced by a recess, in comparison to the thickness or diameter of adjacent sections. The recess region influences the field profile so that in the central region, the field profile is slightly flattened. In the described solution, however, the improvement is not significant, and the process to realise it is rather complicated. Besides, the average field created by the recessed conductor is lower than that created by normal conductor with the same outline dimensions and current.

It is an object of the present invention to provide a method and means for obtaining a more homogeneous magnetic field, the magnetic field being generated by current flowing through a conductor.

The above objective is accomplished by a method and device according to the present invention.

In a first aspect, the present invention provides an integrated circuit arrangement having at least one electrical conductor which, when a current flows through it, produces a magnetic field which acts on at least a further part of the circuit arrangement. The electrical conductor has a first side oriented towards the at least further part of the circuit arrangement and comprises a main line of conductive material, and, connected to its first side, at least one field shaping strip made of magnetic material. Due to the field shaping strip, the inhomogeneity of the magnetic field profile above the electrical conductor is reduced.

The at least one field shaping strip may be made of a material having a permeability of 100 or higher. Permeability of ferromagnetic material can range up to hundreds of thousand. The higher the permeability, the better the field shaping characteristics of the field shaping strip. The material may furthermore be made of a material having a coercivity of 1 kA/m or lower.

The conductive material may be a metal, such as e.g. Cu, or a metal alloy. The magnetic material may for example be permalloy.

The electrical conductor may furthermore comprise, at an interface between the main line of conductive material and the magnetic strip, a first adhesion layer. The electrical conductor may furthermore comprise a second adhesion layer at a side of the magnetic strip opposite to the side attached to the first side of the electrical conductor. The first and/or second adhesion layers may be made of a metal such as Ta for example, although the material is not really important provided that it results in reasonably good adhesion.

The electrical conductor has a length in its longitudinal direction, and the magnetic strip may extend over a majority portion of the length of the electrical conductor. Alternatively, the at least one strip of magnetic material may comprise a plurality of separate segments of magnetic material over the length of the electrical conductor, in order to reduce the shape anisotropy, thus resulting in a higher permeability of the strip when the field is applied in the transverse direction. The segments in this case may have a low aspect ratio, i.e. larger than 1 but not too much.

The electrical conductor has a width in its transversal direction, and the magnetic strip may be located substantially centrally on the electrical conductor, with respect to its width.

At least two electrical conductors may be provided which are located in two different planes and cross at an angle with respect to each other, the further part being located between the two different planes and the further part being located at a crossing point of two electrical conductors. The further part may then be influenced by combined magnetic fields from the two electrical conductors only, the magnetic field from one single conductor not being sufficiently strong to have any significant impact on the further part.

Some or all of the at least two electrical conductors may be provided with a magnetic strip.

The further part may for example be an MRAM device. The field profile reshaped due to the presence of the field shaping strip, improves switching, or rotation, of the MRAM devices with switching magnetic field directions.

In a second aspect, the present invention provides a method for producing an integrated circuit arrangement having at least one electrical conductor which, when a current flows through it, produces a magnetic field which acts on at least a further part of the circuit arrangement. The method comprises:
 providing a main line of conductive material to form part of the electrical conductor, the electrical conductor having a first side oriented towards the at least further part of the circuit arrangement, and
 shaping the magnetic field adjacent the first side by providing, attached to the first side of the electrical conductor, at least one magnetic strip.

At least one magnetic strip may be made of material having a permeability of 100 or higher. The material of the magnetic strip may have a coercivity of 1 kA/m or lower.

The main line of conductive material may be provided by a damascene process.

A method according to the present invention may furthermore comprise providing a first adhesion layer between the main line and the strip. The method may furthermore comprise providing a second adhesion layer at a side of the strip facing away from the first side of the electrical conductor.

A method according to the present invention may further comprise forming a plurality of separate segments of the strip over the length of the electrical conductor.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

FIG. 1 is a perspective view of a common 1T1MTJ MRAM design comprising a plurality of memory cells and orthogonal bit lines and digit lines. Magnetic tunnel junctions (MTJ) are placed at the intersection regions of the bit lines and digit lines. The bottom electrodes of the MTJs are connected to selection transistors with vias V, which are used when reading the memory cells.

FIGS. 3A and 3B shows two common magnetisation patterns of small ferromagnetic elements at remanence state. The case of FIG. 3A is called C-type and the case of FIG. 3B is called S-type.

FIGS. 9A-9D illustrate different steps in an embodiment of a method according to the present invention for producing a composite conductor (digit line) according to an embodiment of the present invention. The dimensions are not to scale.

FIGS. 10A-10D illustrate different steps in a second embodiment according to the present invention for producing a composite conductor (bit line) according to another embodiment of the present invention. The dimensions are not to scale.

Figure 2A:
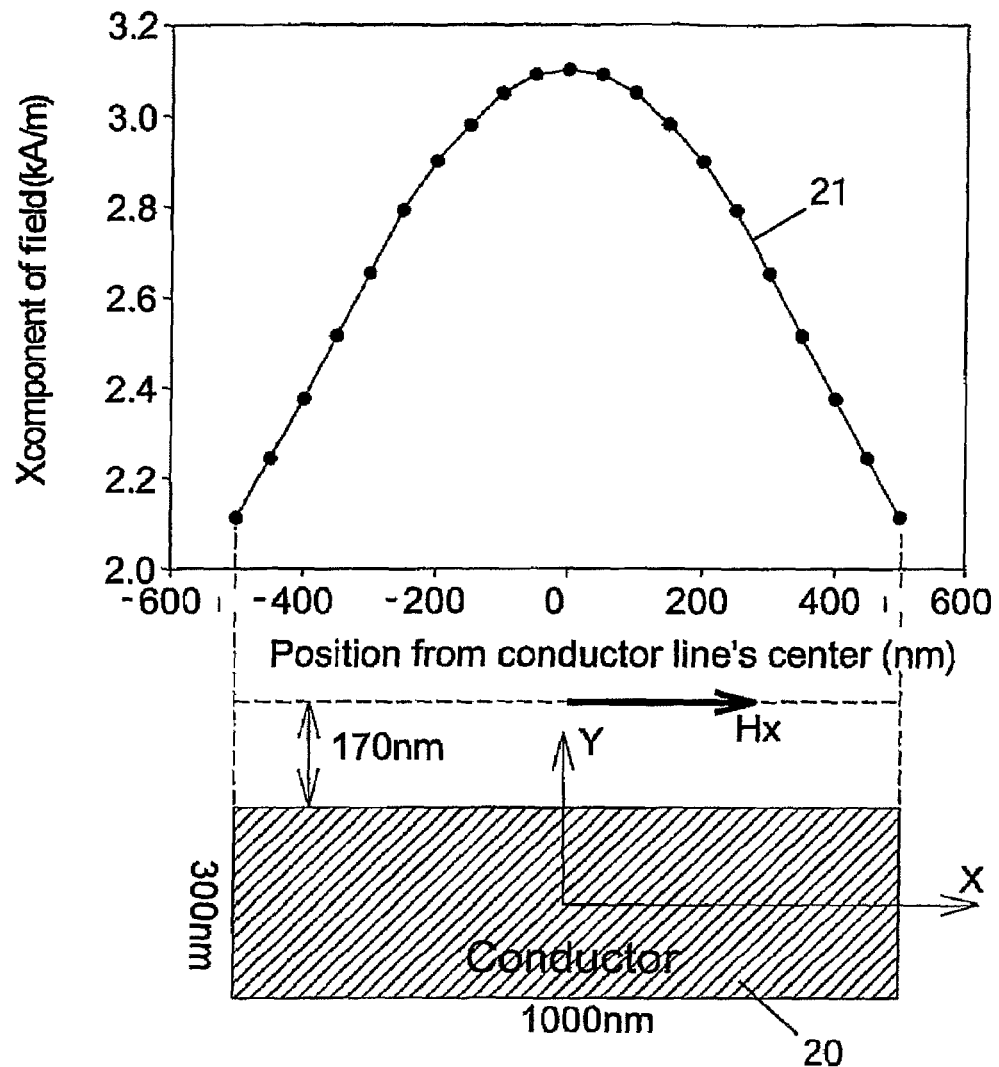
FIG. 2A is a graph illustrating that component of the magnetic field created by a current flowing through a straight conductor, which component lies in a direction orthogonal to the direction of the current flow, in function of position in that orthogonal direction.
Figure 2B:
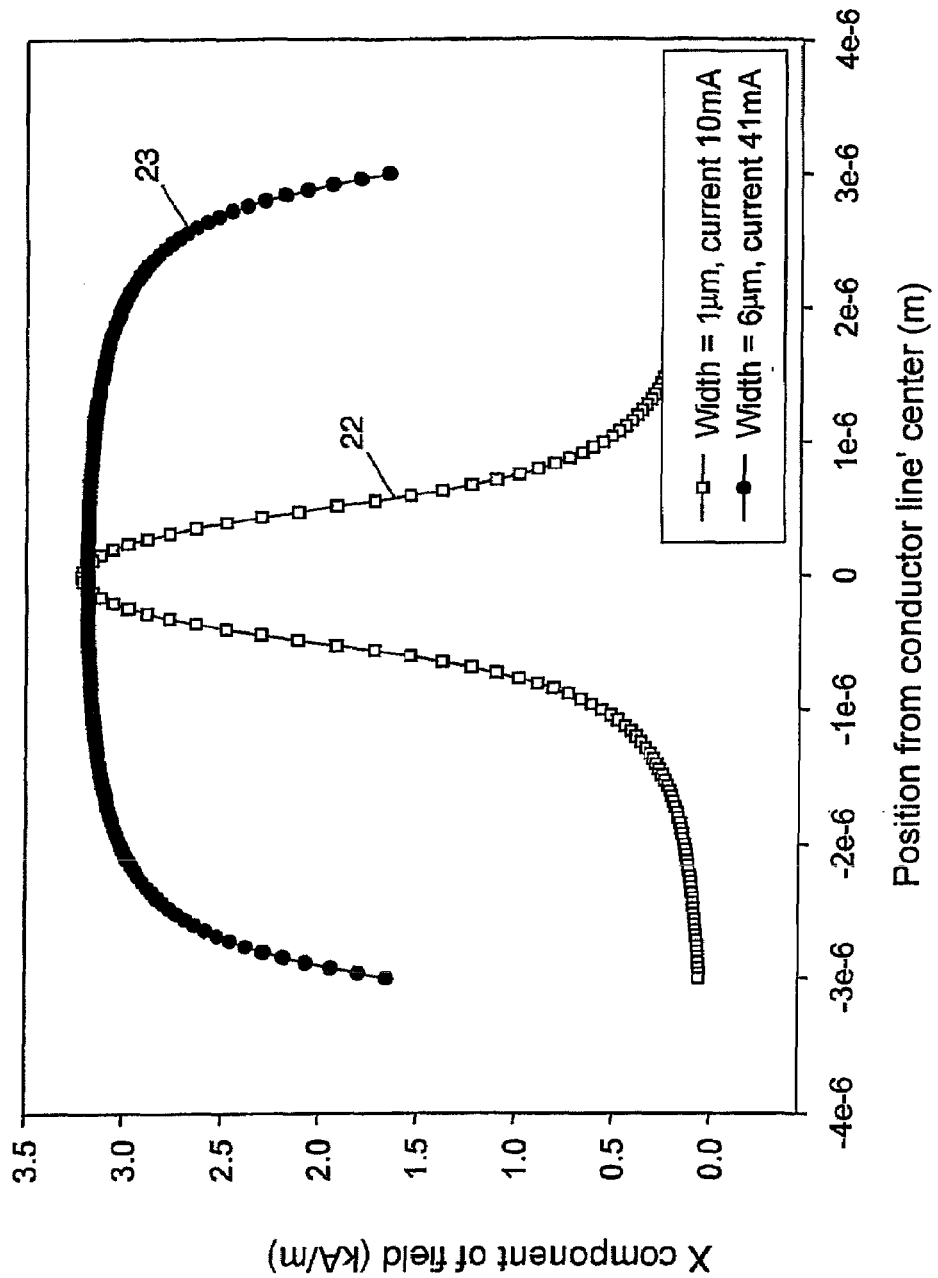
FIG. 2B illustrates the influence of conductor width on the shape of the magnetic field curve.

In the different figures, the same reference figures refer to the same or analogous elements.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

According to the present invention, composite conductors 40 comprising different materials are used to reduce the inhomogeneity of the magnetic field generated by current flowing through the conductor 40, e.g. the write field in an MRAM array.

Figure 4:
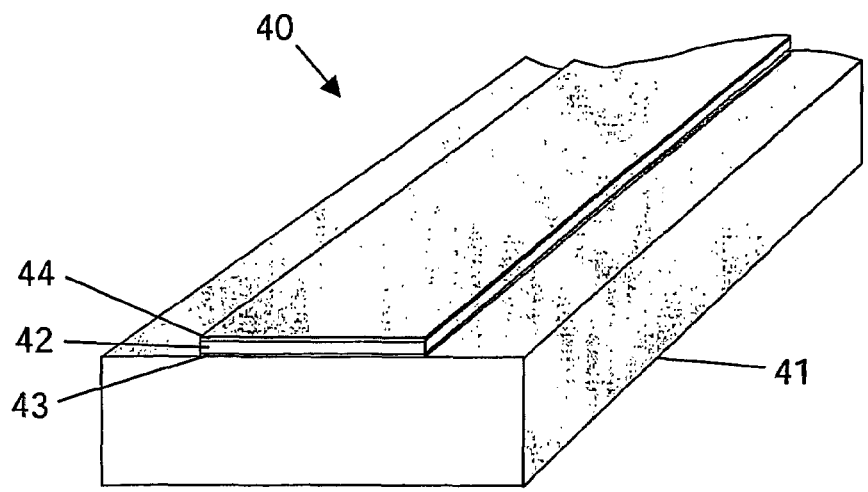
FIG. 4 is a perspective view of a composite conductor according to an embodiment of the present invention, which consists of a main conductor onto which a thin strip of a high permeability soft magnetic material is attached.

A conductor 40 according to an embodiment of the present invention, as illustrated in FIG. 4, comprises a main conductor line 41 made of a conductive material, e.g. Cu, with on its surface a thin, e.g. a few nm thick, such as for example between 1 and 10 nm thick strip 42 made of a high permeability soft magnetic material, e.g. permalloy, which is an alloy made of nickel and iron, and is denoted as Py in the following. A typical composition of a permalloy is 80% Ni and 20% Fe. Another example is the supermalloy having a composition of 80% Ni, 15% Fe and 5% Mo. Another example of such material is CoFe alloy which contains 90% Co and 10% Fe. The (relative) permeability of a material is the ratio of the ability of the material to carry magnetic flux in comparison to air or a vacuum, the permeability of which is, by definition, one. With a high permeability material in the present invention is meant a material having a permeability of at least 100. Soft magnetic material means a ferromagnetic material that has a low coercivity of less than ~1 kA/m (12.5 Oe). Coercivity of a magnetic material is the value of a negative field at which the magnetisation of the material is reduced to zero, after being saturated at the positive direction.

The conductor 40 is part of a circuit arrangement, especially an integrated circuit arrangement, and when current is flowing through it, it produces a magnetic field which acts on at least one further part of the circuit arrangement. The thin strip 42 of high permeability soft magnetic material is applied at that surface of the conductor line 41 which is oriented towards the further part of the circuit arrangement onto which the magnetic field acts. To improve the adhesion between the high permeability soft magnetic strip 42 and the conductor line 41 a first adhesion layer 43 may be applied at the interface between the high permeability soft magnetic strip 42 and the conductor line 41. To improve adhesion between the high permeability soft magnetic strip 42 and an insulator material which will be deposited in the next step onto the whole structure, a second adhesion layer 44 may be applied on top of the high permeability soft magnetic strip 42. The adhesion layers may be made of refractory metals such as Ta, Mo, W, Ti or their compounds such as TiN, depending on the materials to be adhered on both sides of the adhesion layer, and be a few nm thick. But other suitable metals, alloys or compounds can be used as adhesion layers as well.

Figures 5A, 5B:
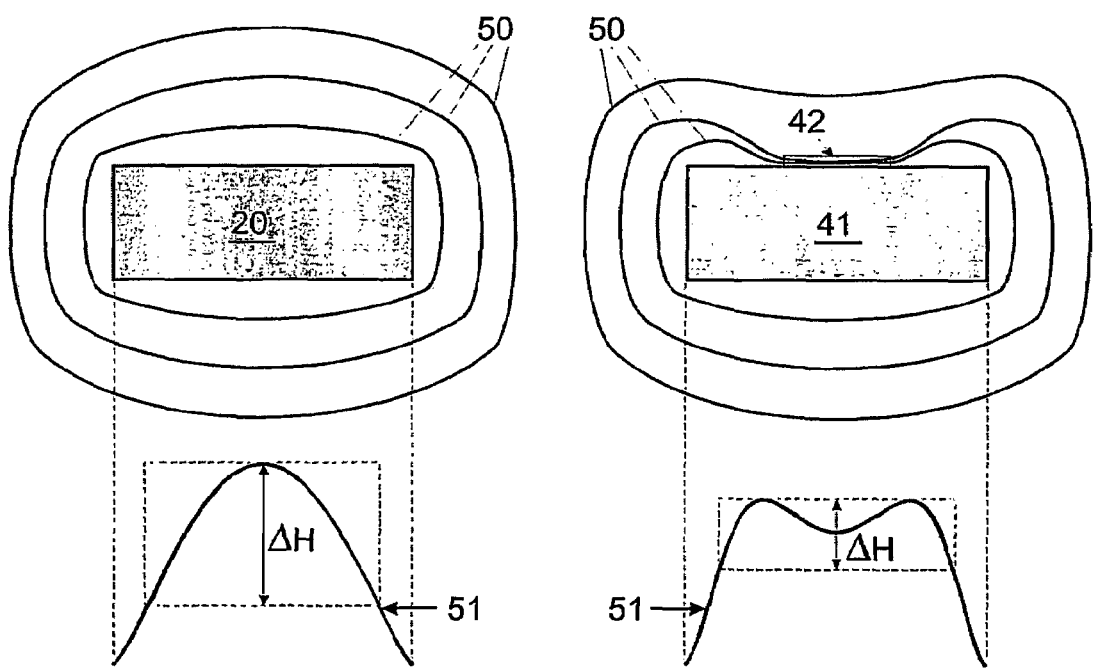
FIGS. 5A and 5B are schematic representations of magnetic flux lines and field profiles in case of a conventional conductor and a conductor according to an embodiment of the present invention respectively. Due to the strip of high permeability material on top of the main conductor, the bell-shaped profile is reshaped into an M-shaped profile.

The strip 42, due to its high permeability, acts as a field shaper to change the magnetic field profile in the space at that side of the conductor line 41 where the strip 42 is located. The strip 42 draws a part of the magnetic flux lines 50 into its body, leaving the region directly above it with less flux lines 50 (a smaller flux density) and consequently releases those flux lines 50 outside the edges of the strip 42, as illustrated in FIG. 5B. As a result, at the central part of the conductor line 41, the magnetic field is suppressed while near the edges of the strip 42, the magnetic field is enhanced. This is shown in the bottom part of FIG. 5B. The high permeability strip 42 only redistributes the magnetic flux density above the top surface of the conductor line 41, but does not reduce the total flux lines. Due to the opposite shape of the field profile 51 in FIG. 5B, compared to that in FIG. 5A, the field inhomogeneity, represented by the maximum field variation ΔH within the same width of the magnetic field profile, is significantly reduced. The low coercivity (magnetic softness) of the strip 42 is preferred, in order to ensure that the field created by the composite conductor follows precisely the current flowing in the conductor without significant hysteresis.

Figures 6A, 6B:
FIGS. 6A and 6B show simulated 2-dimensional X-component magnetic field images of, respectively, a pure Cu conductor and the same conductor onto which a sandwich of a 2 nm Ta/10 nm Py/2 nm Ta strip is attached, in which Py means permalloy.

FIGS. 6A and 6B show an example of simulated magnetic field images (X-field component) created by a conductor in two cases: (a) a pure Cu conductor 20 and (b) the same conductor line 41 onto which a sandwich 43, 42, 44 of a 2 nm Ta/10 nm Py/2 nm Ta is attached. The conduction and the self-field created by the Ta/Py/Ta stack is also taken into account in the simulation. The lines with the arrows indicate the plane on which the further part of the integrated circuit arrangement onto which the generated magnetic field acts, e.g. the MRAM element, is supposed to lie. The distance from this plane to the conductor surface is 170 nm, as an example only. The conductor 20, 41 cross-section is 1000×300 nm².

Figure 7:
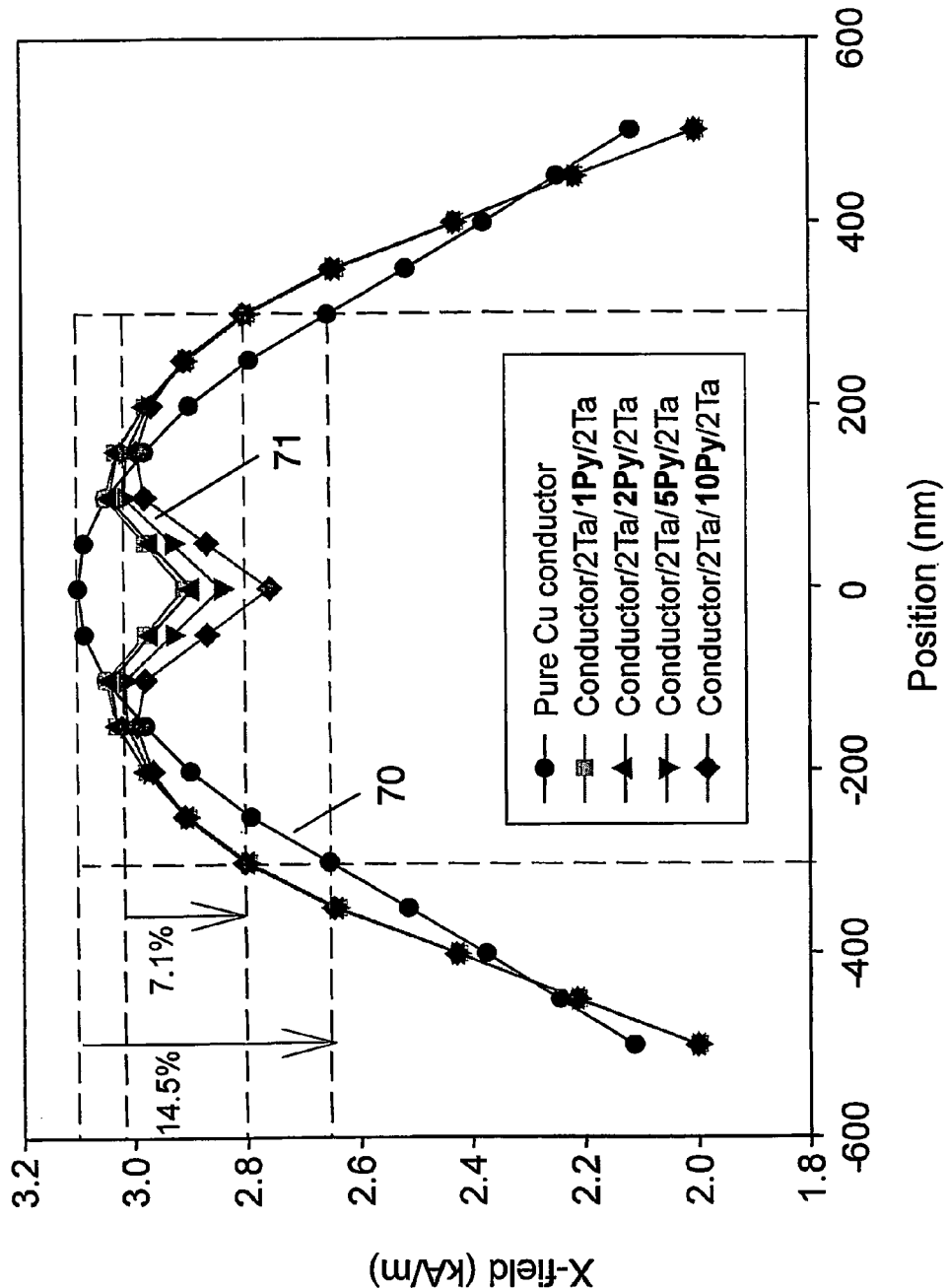
FIG. 7 illustrates field profiles of a pure Cu conductor compared to those of composite conductors according to embodiments the present invention having different Py thicknesses.

The effect of the high permeability soft magnetic strip 42, even when it is only a few nm thick, is very pronounced. FIG. 7 shows the field profiles of several cases according to the present invention with varied Py thickness. The profiles are calculated at the plane indicated by the lines with the arrows in FIG. 6. The thicknesses in the caption are in nm. It is shown in the graphs that the thicker the Py strip 42, the more pronounced the effect becomes. Supposing that the MRAM element width is 500 nm (indicated in FIG. 7 by the two vertical dashed lines), it can be seen that using 5 nm thickness of Py strip 42, the field homogeneity is reduced from 14.5% with the pure Cu conductor 20 (graph 70) to 7.1% with the composite conductor 40 (graph 71). The graphs show that 5 nm of Py is the optimum thickness for the best magnetic field homogeneity within the space containing e.g. the MRAM element. Depending on the distance between conductor line 41 and element onto which the generated magnetic field acts, the widths of the conductor 40 and the element, and the material of the high permeability soft magnetic strip 42, a proper thickness and width of the strip 42 can be chosen. The width of strip 42 has an influence on the magnetic field shape such that, when the strip 42 becomes wider, the two peaks of the profile shift further apart, and the valley between them becomes deeper.

Besides improving the homogeneity of the magnetic field at the location of the element, the field profile according to the present invention favours the magnetic rotation of the end regions of the element more than the central region, as can be seen from FIG. 7 where the magnetic field is larger at the end region than at the central region of the element, making the switching process easier.

Figure 8:
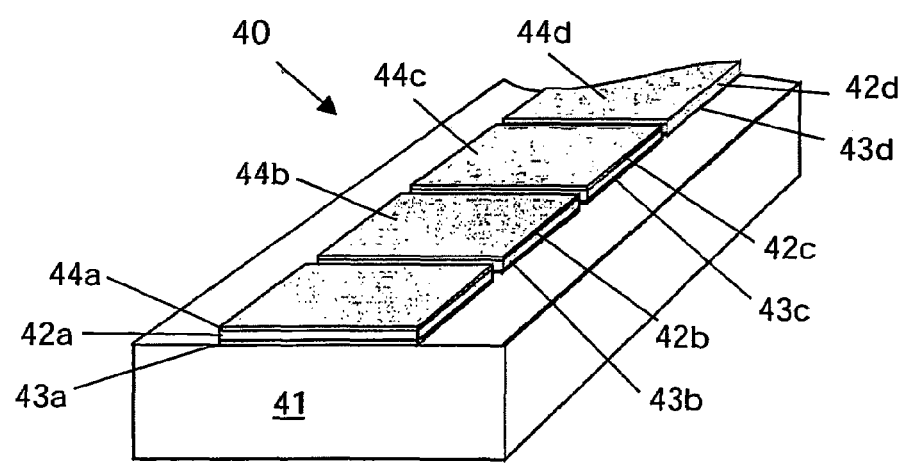
FIG. 8 is a perspective view of a composite conductor according to a second embodiment of the present invention, which consists of a main conductor onto which a strip of a high permeability soft magnetic material is attached, the strip being segmented to reduce the shape anisotropy along the strip direction.

The above simulation of FIG. 6 is done using a 2D model. In fact, the high permeability strip 42 is extended in the longitudinal direction of the conductor line 41 (as in FIG. 4), thus producing a very strong shape anisotropy along the strip 42. This shape anisotropy is obviously not desired because it would result in low permeability of the strip 42 when the field is applied in the transverse direction, which is the case here. The permeability mentioned so far is supposed to be close to the bulk value, that is the permeability value measured in a big sample, which is not significantly affected by the shape and size of the sample. If the magnetic body becomes small and more important, has a large aspect ratio, the B-H curves measured along different axes will be different due to the demagnetising effect. For instance, if measuring along the longitudinal direction (easy axis), the magnetisation curve is steeper than that along the transverse direction (hard axis). Therefore, the permeability, being the slope of the B-H curve, varies depending on the direction of the magnetisation process and the aspect ratio of the magnetic body. For higher permeability, it is preferred that the shape anisotropy of the strip be reduced. Therefore, according to a further embodiment of the present invention, the strip 42 may be segmented into strip regions 42*a*, 42*b*, 42*c*, 42*d* in order to reduce the shape anisotropy. The first and second adhesion layers 43, 44, if present, are segmented accordingly into first and second adhesion regions 43*a*, 43*b*, 43*c*, 43*d*, 44*a*, 44*b*, 44*c*, 44*d*. This is illustrated in FIG. 8. It follows easily that the adhesion layers are also segmented together with the magnetic strip 42 because in fact, the segmentation is done at the same time with defining the strip 42.

A number of possible process recipes exist to realise a composite conductor according to embodiments of the present invention. Below some examples will be given.

A first embodiment of a fabrication method is illustrated in FIG. 9A-9D. It may be used for making digit lines in MRAM cells, i.e. conductors located in a metal layer below an MTJ stack.

The main conductor line, of e.g. Cu, can be made by a damascene technique as illustrated in FIG. 9A. In that case, first a substrate 90 is provided. In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. a doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or an $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer. In the following reference will be made to silicon processing as silicon semiconductors are commonly used, but the skilled person will appreciate that the present invention may be implemented based on other semiconductor material systems and that the skilled person can select suitable materials as equivalents of the dielectric and conductive materials described below. Furthermore, the "substrate" may be a part of an ic being half-way fabricated, for instance, the si wafer after processing the front-end of the process line, which already contains transistors and other semiconductor-based devices. This is the case in particular for MRAM, because MRAM structures are located in between two consecutive interconnect layers, which lie in the back-end of the process line.

On top of the substrate, a first dielectric layer 91, such as for example a $SiO_2$ layer, is provided. A damascene process is a process in which metal lines are delineated in dielectrics isolating them from each other, not by means of lithography and etching, but by means of chemical-mechanical planarisation or polishing (CMP). In this process, the pattern of the metal lines is first lithographically defined in the layer of dielectric material in the form of trenches. Then metal is deposited to fill the resulting trenches, and then excess metal is removed by CMP. This results in a main conductor 92 being formed, as illustrated in FIG. 9A.

Thereafter, a layer 93 of high permeability material is provided on top of the main conductor 92 and the first dielectric layer 91. In the example illustrated in FIG. 9B, this layer 93 of high permeability soft magnetic material consists of a stack of Ta/Py/Ta, but the layer can be made of any other suitable material or stack of materials. An adhesion layer (such as the Ta layer in the example given) may or may not be present. By means of a lithography step using resist 94, the high permeability soft magnetic strip 95 is defined. The layer 93 is then etched as shown in FIG. 9C using wet or dry etch (e.g. sputter etching, ion beam etching, reactive ion etching, etc.), the etch stopping at the Cu—$SiO_2$ surface. The result is illustrated in FIG. 9C. The resist 94 is then removed and the wafer is covered with an insulator layer 96 such as $SiO_2$, followed by a CMP process to flatten the surface, as illustrated in FIG. 9D, in order to enable further processing, such as e.g. in case of the integrated circuit arrangement comprising an MRAM device, providing an MTJ stack and structuring MTJ elements. On top of that, or alternatively, other parts of an integrated circuit arrangement may be formed.

A second embodiment of a fabrication method is illustrated in FIG. 10A-10D. It may be used for making bit lines in MRAM cells, i.e. conductors located in a metal layer above an MTJ stack.

For such bit lines the fabrication order is reversed, i.e. the high permeability soft magnetic strip is created first and then the main conductor line. After the relevant part of the integrated circuit, e.g. the MTJ 100, has been structured on an underlying substrate 90, which may comprise any underlying material or materials that may be used, or elements for layers that underlie a layer or portion of interest, and after the relevant part of the integrated circuit, e.g. MTJ 100, has been isolated with insulating material 101, e.g. $SiO_2$, the surface 102 is CMPed, as illustrated in FIG. 10A.

Thereafter a layer 93 of high permeability soft magnetic material is provided on top of the relevant part of the integrated circuit, e.g. the MTJ 100. In the example illustrated in FIG. 10B, this layer 93 of high permeability soft magnetic material consists of a stack of Ta/Py/Ta, but the high permeability layer 93 can be made of any other suitable material or stack of materials. An adhesion layer (such as the Ta layer in the example given) may or may not be present. By means of a lithography step using resist 94, the high permeability strip 95 is defined. The layer 93 is then etched as shown in FIG. 10C using wet or dry etch (e.g. sputter etching, ion beam etching, reactive ion etching, etc.), the etch stopping on the $SiO_2$ surface (FIG. 10C).

The resist 94 is then removed and the wafer is covered with an insulator layer 102 such as $SiO_2$. A damascene process is carried out to provided metal lines in the dielectric material 102. The trench pattern of the metal lines is first lithographically defined in the layer 102 of dielectric material. Then metal is deposited to fill the resulting trenches, and then excess metal is removed by CMP. This results in a main conductor 92 being formed, as illustrated in FIG. 10D.

According to a further embodiment of the present invention, not represented in the drawings, the conductor may also be provided with a cladding layer, as detailed in WO 02/41367. The cladding layer typically covers three sides of the conductor, leaving the fourth side open. The open side faces the MTJ element, and the strip will be placed at this fourth side. The cladding layer increases the field in the half space above the conductor plane, e.g. it approximately doubles the field. This is because the cladding layer concentrates most of the flux lines to the upper halve-space above the open side of the conductor line, leaving the lower halve-space with very few flux lines. The exact value of the increase depends on the thickness of the cladding layer. In the optimum case, this value is close to double. Without the permalloy strip the field profile is still bell-shaped. By adding the permalloy strip; the field profile will be reshaped to M-shaped in the same way as described above.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. An integrated circuit arrangement comprising at least one electrical conductor which, when a current flows through the electrical conductor, produces a magnetic field which acts on at least a further part of the circuit arrangement, the electrical conductor having a first side oriented towards the at least further part of the circuit arrangement, wherein the electrical conductor including a main line of conductive material, and, connected to the first side of the electric conductor, at least one field shaping strip made of magnetic material.

2. An integrated circuit arrangement according to claim 1, wherein the at least one field shaping strip is made of a material having a permeability of 100 or higher.

3. An integrated circuit arrangement according to claim 1, wherein the at least one field shaping strip is made of a material having a coercivity of 1 kA/m or lower.

4. An integrated circuit arrangement according to claim 1, wherein the magnetic material is permalloy.

5. An integrated circuit arrangement according to claim 1, the electrical conductor having a length in its longitudinal direction, wherein the magnetic strip extends over a majority portion of the length of the electrical conductor.

6. An integrated circuit arrangement according to claim 1, the electrical conductor having a length in its longitudinal direction, wherein the at least one strip of magnetic material comprises a plurality of separate segments of magnetic material over the length of the electrical conductor.

7. An integrated circuit arrangement according to claim 1, the electrical conductor having a width in its transversal direction, wherein the magnetic strip is located substantially centrally on the electrical conductor, with respect to its width.

8. An integrated circuit arrangement according to claim 1, wherein at least two electrical conductors are provided which are located in two different planes and cross at an angle with respect to each other, the further part being located between the two different planes and the further part being located at a crossing point of two electrical conductors.

9. An integrated circuit arrangement according to claim 8, wherein all of the at least two electrical conductors are provided with a field shaping strip of magnetic material.

10. An integrated circuit arrangement according to claim 8, wherein the further part is an MRAM device.

11. A method for producing an integrated circuit arrangement having at least one electrical conductor which, when a current flows though the electrical conductor, produces a magnetic field which acts on at least a further part of the circuit arrangement, the method comprising: providing a main line of conductive material to form part of the electrical conductor, the electrical conductor having a first side oriented towards the at least further part of the circuit arrangement, and shaping the magnetic field adjacent the first side of the electrical conductor by providing, attached to the first side of the electrical conductor, at least one magnetic strip.

12. The method of claim 11 wherein the at least one magnetic strip is made of material having a permeability of 100 or higher.

13. The method of claim 11, wherein the magnetic strip is made of material having a coercivity of 1 kA/m or lower.

14. A method according to claim 11, wherein the main line of conductive material is provided by a damascene process.

15. A method according to claim 11, wherein the electrical conductor has a length in its longitudinal direction, the method further comprising forming the magnetic strip by forming a plurality of separate segments of magnetic material over the length of the electrical conductor.

* * * * *